(12) United States Patent
Lee

(10) Patent No.: US 9,184,009 B2
(45) Date of Patent: Nov. 10, 2015

(54) ELECTRONIC SWITCHING DEVICE AND METHOD FOR MANUFACTURING THE SAME

(71) Applicant: LSIS CO., LTD., Anyang-si, Gyeonggi-do (KR)

(72) Inventor: Sang Jin Lee, Daegusi (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 42 days.

(21) Appl. No.: 13/901,425

(22) Filed: May 23, 2013

(65) Prior Publication Data

US 2013/0321108 A1 Dec. 5, 2013

(30) Foreign Application Priority Data

May 30, 2012 (KR) ........................ 10-2012-0057475

(51) Int. Cl.
*H01H 51/00* (2006.01)
*G01R 31/327* (2006.01)
*H01H 9/02* (2006.01)
(Continued)

(52) U.S. Cl.
CPC ........... *H01H 51/00* (2013.01); *G01R 31/3278* (2013.01); *H01H 9/02* (2013.01); *H01H 11/0062* (2013.01); *H01H 49/00* (2013.01); *H01H 50/06* (2013.01); *H01H 2001/0021* (2013.01); *H01H 2009/0292* (2013.01); *H01H 2011/0075* (2013.01); *Y10T 29/49105* (2015.01)

(58) Field of Classification Search
CPC ........... G01R 31/3278; H01H 11/0062; H01H 2009/0292; H01H 2001/0021
USPC ..................................... 324/415–424; 335/17
See application file for complete search history.

(56) References Cited

U.S. PATENT DOCUMENTS

| 5,907,267 | A | * | 5/1999 | Reid et al. ........................ 335/17 |
| 6,150,909 | A | * | 11/2000 | Meier ............................ 335/132 |
| 2010/0079973 | A1 | | 4/2010 | Brandt et al. |

FOREIGN PATENT DOCUMENTS

| CN | 1701403 | 11/2005 |
| FR | 2388391 | 11/1978 |

(Continued)

OTHER PUBLICATIONS

Japan Patent Office Application Serial No. 2013-112729, Office Action dated Jun. 20, 2014, 3 pages.

(Continued)

*Primary Examiner* — Ramon Barrera
(74) *Attorney, Agent, or Firm* — Lee, Hong, Degerman, Kang & Waimey

(57) ABSTRACT

Provided are an electronic switching device and a method for manufacturing the same. The electronic switching device includes a fixed unit including a fixed unit body defining an outer appearance thereof and a fixed contact part disposed within the fixed unit body, a movable unit including a movable contact part selectively contacting the fixed contact part to supply current, a moving part provided in the movable unit to guide a movement of the movable contact part toward the fixed contact part, a coil to which power is applied to move the moving part, and an elastic member that is elastically deformable while the moving part moves. At least one of the fixed unit and the moving part has a through hole so that an inner component of the fixed unit or the moving part communicates with the outside to allow a preset signal to pass therethrough.

9 Claims, 13 Drawing Sheets

(51) Int. Cl.
*H01H 11/00* (2006.01)
*H01H 50/06* (2006.01)
*H01H 49/00* (2006.01)
*H01H 1/00* (2006.01)

(56) References Cited

FOREIGN PATENT DOCUMENTS

| GB | 2479524 | 10/2011 |
|----|---------|---------|
| JP | 2003-308771 | 10/2003 |
| JP | 2012-089484 | 5/2012 |
| JP | 2012-089491 | 5/2012 |

OTHER PUBLICATIONS

European Patent Office Application Serial No. 13169442.4, Search Report dated Sep. 20, 2013, 7 pages.
Japan Patent Office Application Serial No. 2013-112729, Office Action dated Mar. 3, 2014, 2 pages.
The State Intellectual Property Office of the People's Republic of China Application Serial No. 201310209711.5, Office Action dated Feb. 9, 2015, 6 pages.

* cited by examiner

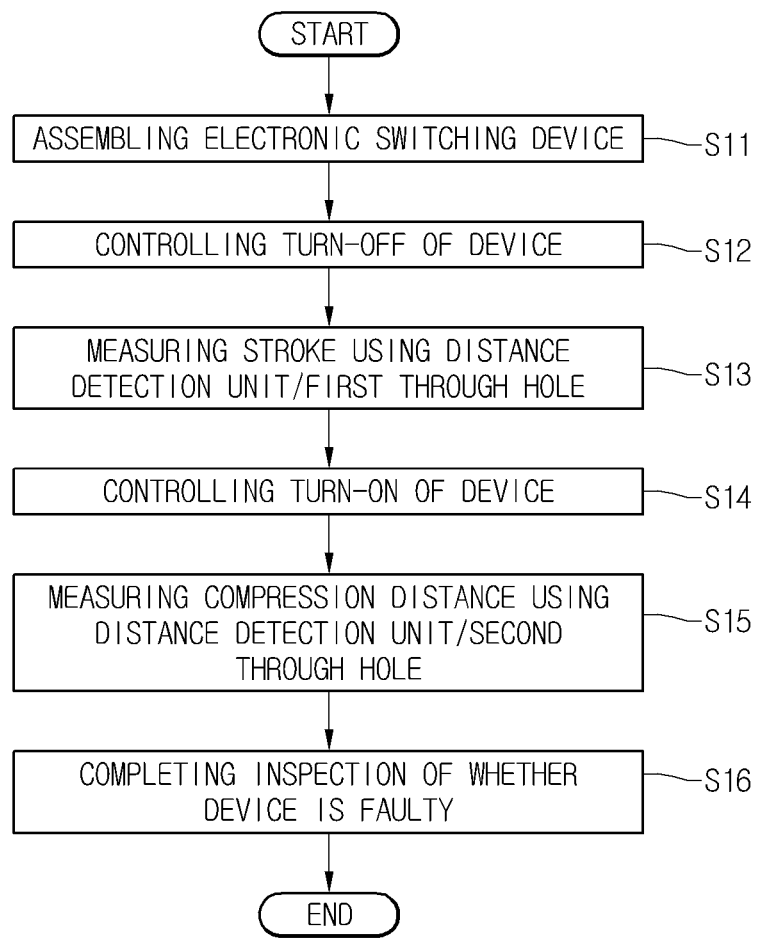

ELECTRONIC SWITCHING DEVICE AND METHOD FOR MANUFACTURING THE SAME

CROSS-REFERENCE TO RELATED APPLICATIONS

Pursuant to 35 U.S.C. §119(a), this application claims the benefit of earlier filing date and right of priority to Korean Patent Application No. 10-2012-0057475, filed on May 30, 2012, the contents of which are hereby incorporated by reference in their entirety.

BACKGROUND

The present disclosure relates to an electronic switching device and a method for manufacturing the same.

Electronic switching devices may be used for various industrial equipment, machineries, and vehicles as electrical contact switching devices that supply or block current.

In general, such an electronic switching device is configured to switch a contact point by an electrical signal. The electronic switching device includes a coil to which power is applied, a movable part movably disposed by magnetic force generated in the coil, a contact part selectively contacting the movable part according to the movement of the movable part, and an elastic member providing restoring force to the movable part.

Also, the electronic switching device includes a fixed contact part fixed to one position of the contact part and a movable contact part disposed on a side of the fixed contact part to selectively contact the fixed contact part according to the movement of the movable part to supply power.

Performance of the electronic switching device may be determined by at least one of a maximum movement distance (hereinafter, referred to as a stroke) of the movable part, a gap that is a distance between the fixed contact part and the movable contact part, and a compression distance of the elastic member. Thus, after the electronic switching device is manufactured, the stroke, the gap, and the compression distance may be measured (inspected) to determine whether the electronic switching device is faulty.

In the electronic switching device according to the related art, a process for measuring the stroke and a process for measuring the gap may be separated to increase a production time of a product.

For example, in case of the electronic switching device according to the related art, a process for manufacturing (assembling) a first process for assembling portions of components of the electronic switching device and a second process for assembling additional components after the first process is completed. Here, the stroke should be measured in a state where the movable part is capable of being exposed to the outside, i.e., before the second process is performed. Also, after the second process is performed, only the gap may be measured in structure of the device.

That is, in the manufacturing process of the device, the processes for inspecting the performance may be separated so that the processes are performed according to a predetermined order. Thus, the manufacturing process may be complicated, and the performance inspection efficiency may be reduced.

Also, in a case where a portion of the processes is omitted, since the product should be disassembled again to inspect the performance, an error with respect to the performance inspection result may occur. Also, in a case where the inspection process is omitted, the product may increase in failure rate.

SUMMARY

Embodiments provide an electronic switching device of which performance inspection is easily performed and a method for manufacturing the same.

In one embodiment, an electronic switching device includes: a fixed unit including a fixed unit body defining an outer appearance thereof and a fixed contact part disposed within the fixed unit body; a movable unit including a movable contact part selectively contacting the fixed contact part to supply current; a moving part provided in the movable unit to guide a movement of the movable contact part toward the fixed contact part; a coil to which power is applied to move the moving part; and an elastic member that is elastically deformable while the moving part moves, wherein at least one of the fixed unit and the moving part has a through hole so that an inner component of the fixed unit or the moving part communicates with the outside to allow a preset signal to pass therethrough.

In another embodiment, a method for manufacturing an electronic switching device includes: assembling a fixed unit and a movable unit which constitute the electronic switching device; transmitting a first detection signal to a first through hole of the fixed unit in a state where power is not applied to the electronic switching device; recognizing a maximum movement distance of the movable unit; transmitting a second detections signal to a second through hole of the movable part in a state where the power is applied to the electronic switching device; and recognizing a compressed length of an elastic member provided in the movable unit.

In further another embodiment, an electronic switching device includes: fixed unit including a fixed unit body defining an outer appearance thereof and a fixed contact part disposed within the fixed unit body; a movable unit including a movable contact part selectively contacting the fixed contact part and provided movably; a contact support part supporting the movable contact part; a coil to which power is applied to move the moving part; an elastic member elastically deformably coupled to the contact support part; a first through hole passing through one surface of the fixed unit, the first through hole being exposed to the outside; and a second through hole passing through one surface of the movable unit, the second through hole being exposed to the outside.

The details of one or more embodiments are set forth in the accompanying drawings and the description below. Other features will be apparent from the description and drawings, and from the claims.

BRIEF DESCRIPTION OF THE DRAWINGS

FIG. 13 is a flowchart illustrating a method for manufacturing the electronic switching device according to an embodiment.

DETAILED DESCRIPTION OF THE EMBODIMENTS

Reference will now be made in detail to the embodiments of the present disclosure, examples of which are illustrated in the accompanying drawings. The invention may, however, be embodied in many different forms and should not be construed as being limited to the embodiments set forth herein; rather, that alternate embodiments included in other retrogressive inventions or falling within the spirit and scope of the present disclosure will fully convey the concept of the invention to those skilled in the art.

Figure 1:
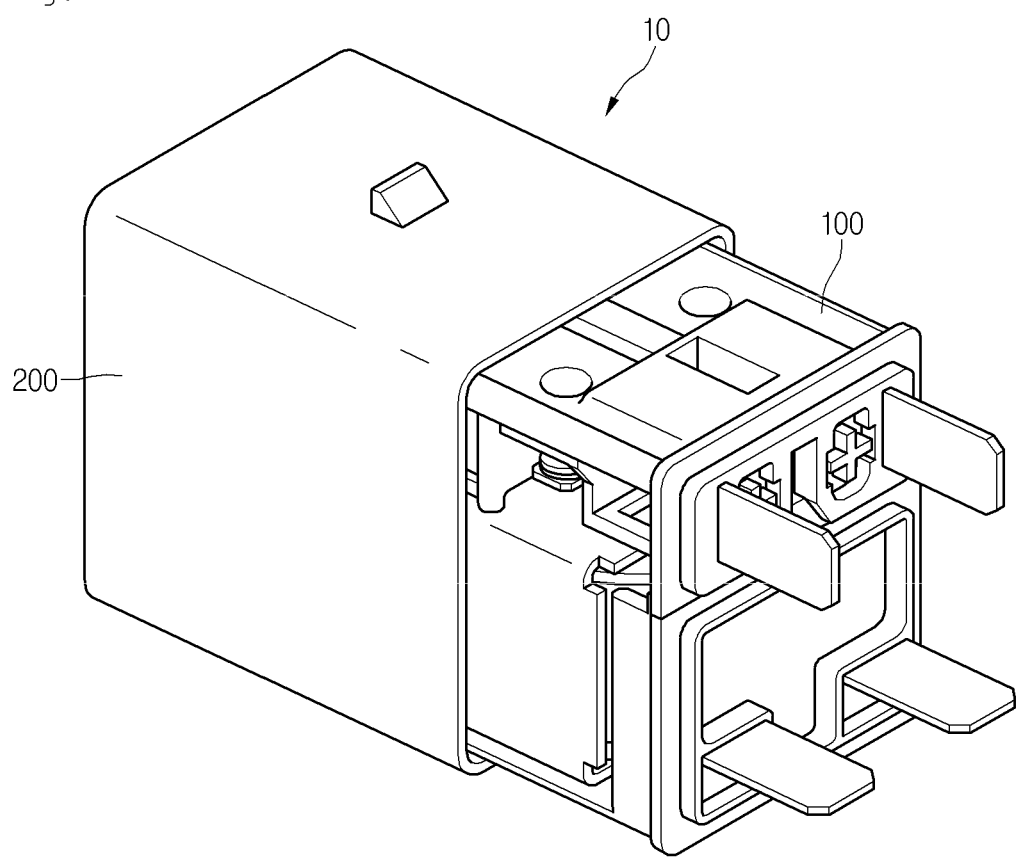
FIG. 1 is a perspective view of an electronic switching device according to an embodiment.
Figure 2:
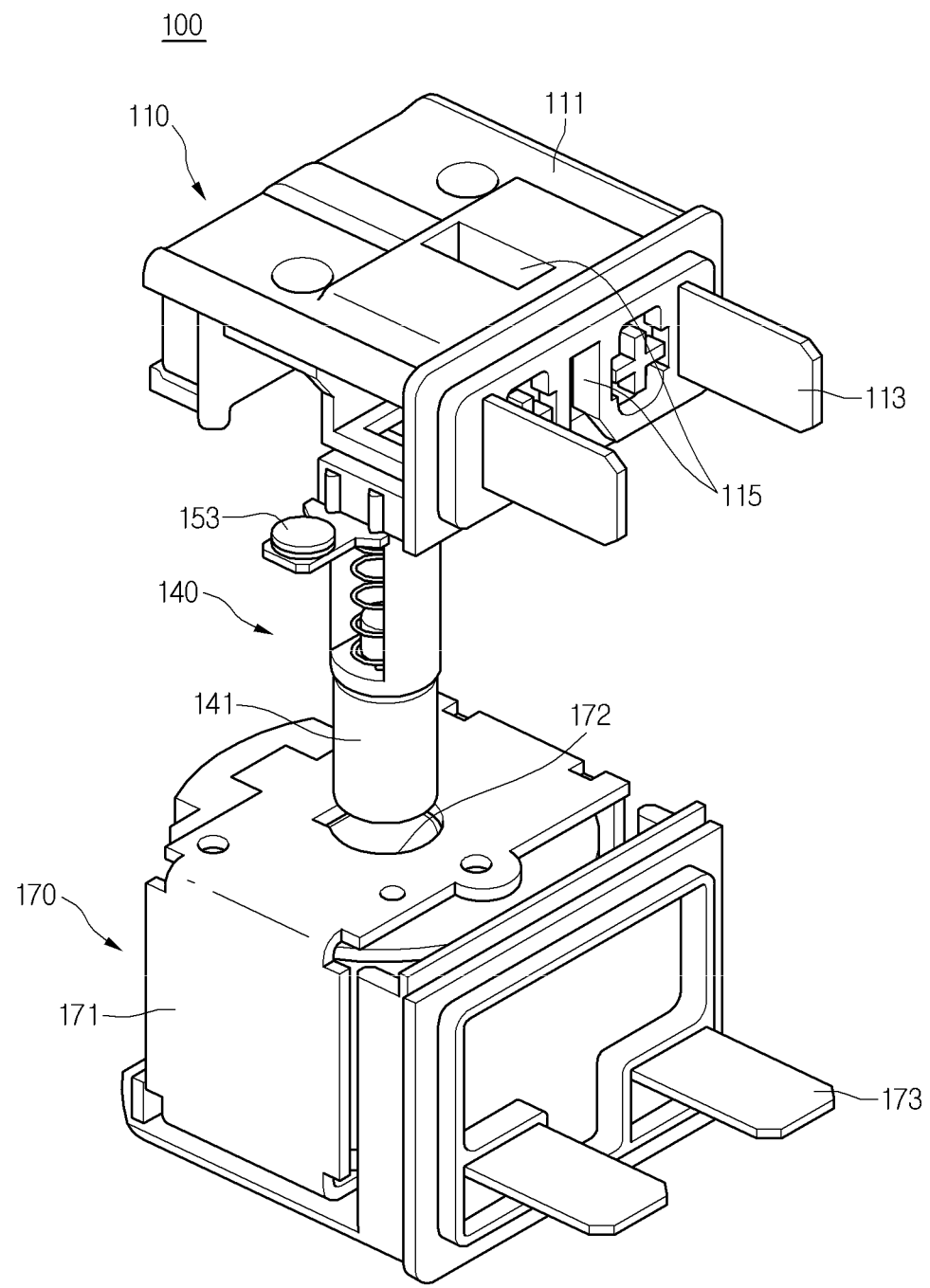
FIG. 2 is an exploded perspective view of a main body according to an embodiment.
Figure 3:
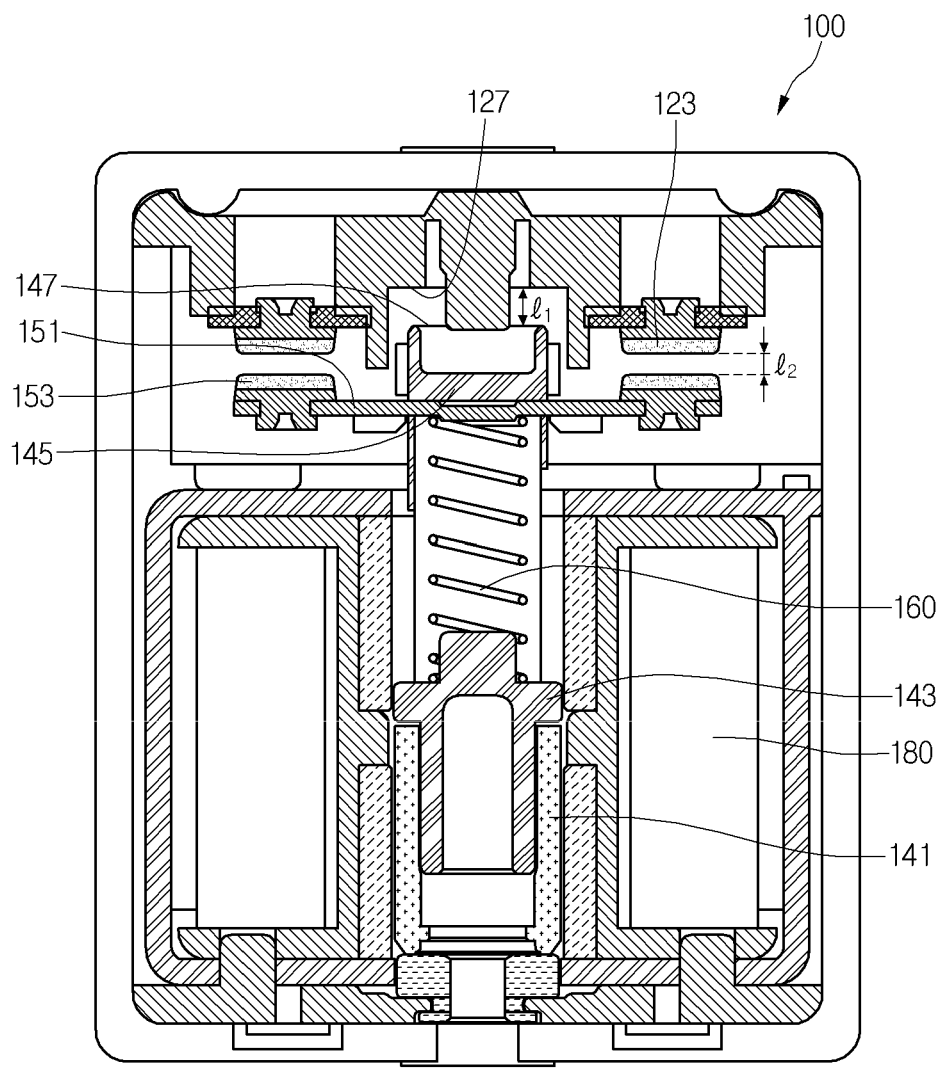
FIG. 3 is a cross-sectional view of a state in which supply of current into the electronic switching device is blocked according to an embodiment.
Figure 4:
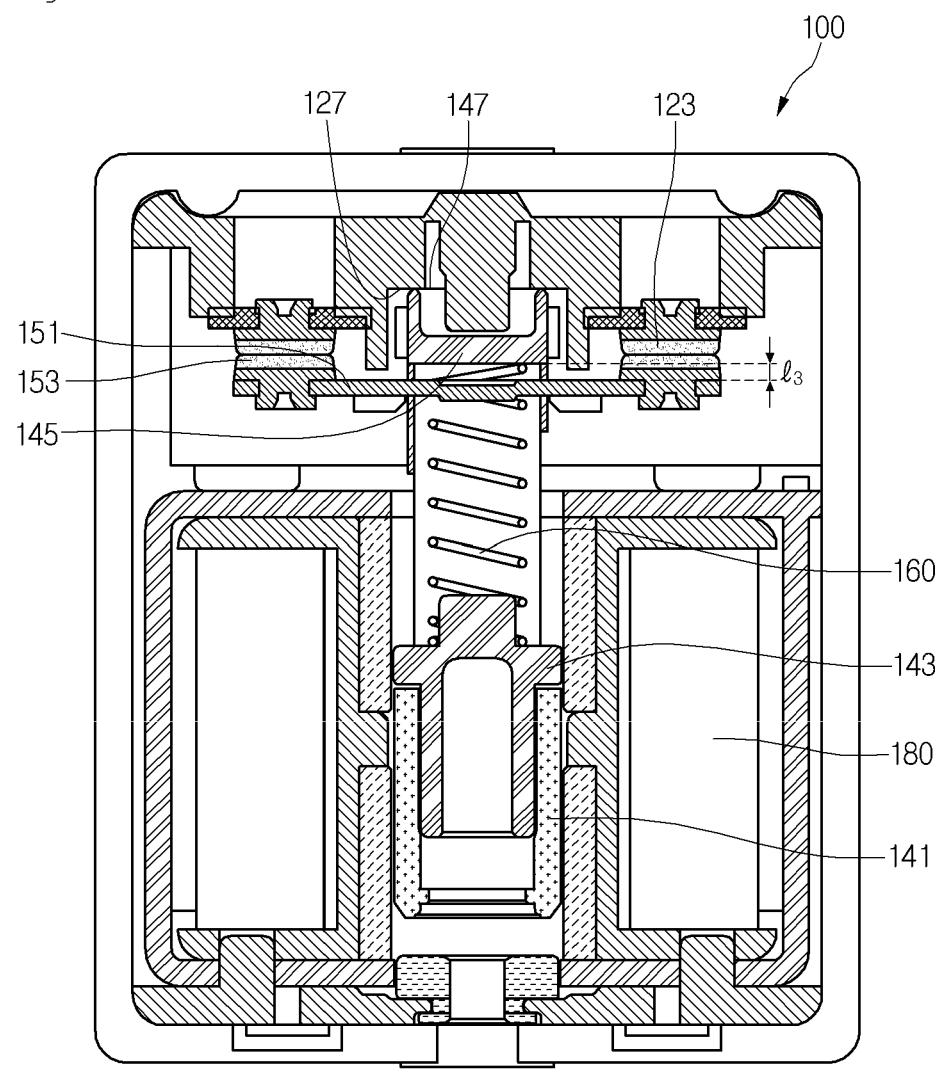
FIG. 4 is a cross-sectional view of a state in which the current is supplied into the electronic switching device according to an embodiment.

FIG. 1 is a perspective view of an electronic switching device according to an embodiment, FIG. 2 is an exploded perspective view of a main body according to an embodiment, FIG. 3 is a cross-sectional view of a state in which supply of current into the electronic switching device is blocked according to an embodiment, and FIG. 4 is a cross-sectional view of a state in which the current is supplied into the electronic switching device according to an embodiment.

Referring to FIGS. 1 to 4, an electronic switching device 10 according to an embodiment includes a main body 100 including a plurality of components for selectively blocking current supply and a housing 200 accommodating the main body 100. The housing 200 has an approximately rectangular shape with an opened front surface. The main body 100 is separably coupled to the housing 200.

In detail, the main body 100 includes a fixed unit 110 fixed to one position of the main body 100, a movable unit 140 movably disposed on a side of the fixed unit 110, and a driving force generation unit 170 providing driving force to move the movable unit 140.

The fixed unit 110 includes a fixed unit body 111 defining an outer appearance thereof, a current supply part 113 protruding from a side of the fixed unit body 111 to supply current to the outside when power is applied into the main body 100, and a first through hole 115 through which at least one portion of the fixed unit body 111 passes.

An accommodation space in which at least one portion of the movable unit 140 is accommodated is defined in the fixed unit 110. Also, the first through hole 115 passes through one surface of the fixed unit body 111 to allow the accommodation space to communicate with the outside. For example, as shown in FIG. 2, the first through hole 115 is recessed from one surface of the fixed body part through which the current supply part 113 protrudes and then extends up to the other surface of the fixed unit body 111 via the accommodation space. For example, the one surface of the fixed unit body may be called a "front surface", and the other surface of the fixed unit body 111 may be called a "top surface".

At least one fixed contact part 123 is provided on the fixed unit 110. For example, the fixed contact part 123 may be provided in two on both sides of the inside of the fixed unit body 111. Also, the fixed contact part 123 may be connected to the current supply part 1123 to supply current to the outside in a state where the fixed contact part 123 contacts the movable unit 140.

The movable unit 140 includes a movable unit body 141 having an approximately cylindrical shape, a moving part 143 coupled to an upper portion of the movable unit body 141 to accommodate an elastic member 160, a contact support part 151 supported by an upper portion of the elastic member 160, and a movable contact part 153 seated on the contact support part 151 to selectively contact the fixed contact part 123.

The movable unit body 141 and the moving part 143 may integrally move. The elastic member 160 may be a compression spring.

The moving part 143 includes a support corresponding part 145 contacting the contact support part 151 in a state where the supply of the current is blocked, i.e., power is not applied to the driving force generation unit 170. The support corresponding part 145 transversely extends from an upper portion of the contact support part 151.

The moving part 143 includes an upper end 147 defining an upper end surface of the moving part 143, i.e., a top surface of the support corresponding part 145. Also, the upper end 147 interferes with an interference surface 127 of the fixed unit 110 in a state where the current is supplied, i.e., the power is applied to the driving force generation unit 170.

The interference surface 127 may be understood as one portion of an inner surface of the fixed unit 110, i.e., one surface transversely extending to interfere with the upper end 147. Also, the interference surface 127 may be defined at a position or height corresponding to an upper end of the first through hole 115. The moving part 143 may move upward until the upper end 147 interferes with the interference surface 127.

The driving force generation unit 170 includes a case 171 defining an outer appearance thereof, a power apply part 173 to which power is applied from the outside, and a coil 180 generating magnetic force when the power is applied to the power apply part 173.

The power apply part 173 may protrude outward from one surface of the case 171, and the coil 180 may be provided within the case 171 to surround a lower portion of the movable unit 140. That is to say, the movable unit 140 is inserted into an accommodation groove 172 defined in a top surface of the case 171 to extend downward.

At least one portion of the movable unit 140 is disposed within the case 171 in a state where the movable unit 140 and the driving force generation unit 170 are coupled to each other. Also, a remaining portion of the movable unit 140 protrudes upward from the case 171.

An effect of the electronic switching device 10 according to an embodiment will be described with reference to FIGS. 3 and 4. FIG. 3 illustrates a state in which the current supply is blocked to the electronic switching device 10, and FIG. 4 illustrates a state in which the current is supplied to the electronic switching device 10.

When power is not applied to the driving force generation unit 170, as shown in FIG. 3, a lower end of the movable unit body 141 is supported by the case 171, and the fixed contact part 123 and the movable contact part 153 are spaced apart from each other. Also, the upper end 147 is spaced downward from the interference surface 127.

Here, a distance $l_1$ (a first distance) between the upper end 147 and the interference surface 127 may be understood as a "stroke", i.e., a maximum distance by which the movable unit 140 may maximally move. Also, a distance $l_2$ (a second distance) between the fixed contact part 123 and the movable contact part 153 may be understood as a "gap".

Also, the elastic member 160 may be in a tensioned (restored) state, and the contact support part 151 supported by the elastic member 160 may contact a bottom surface of the support corresponding part 145.

When the power is applied to the coil 180, as shown in FIG. 4, the magnetic force may be generated around the coil 180, and thus, the movable unit 140, i.e., the movable unit body 141 and the moving part 143 may move upward toward the fixed unit 110.

While the movable unit 140 moves upward, the movable contact part 153 may be guided to move upward, and thus, the fixed contact part 123 and the movable contact part 153 may contact each other. Also, in the state where the fixed contact part 123 and the movable contact part 153 contact each other, the movable unit 140 may further move upward to compress the elastic member 160.

When the elastic member 160 is compressed, the contact support part 151 supported by the elastic member 160 relatively moves downward with respect to the movable unit 140. That is, the contact support part 151 is spaced apart from the support corresponding part 145.

Here, a distance l3 (a third distance) spaced between the contact support part 151 and the support corresponding part 145 may be a compression distance to correspond to a compressed length of the elastic member 160. Also, the compression distance may be defined as a "stroke—gas".

The stroke, the gap, and the compression distance may be understood as important factors for determining performance of the electronic switching device 10.

Figure 5:
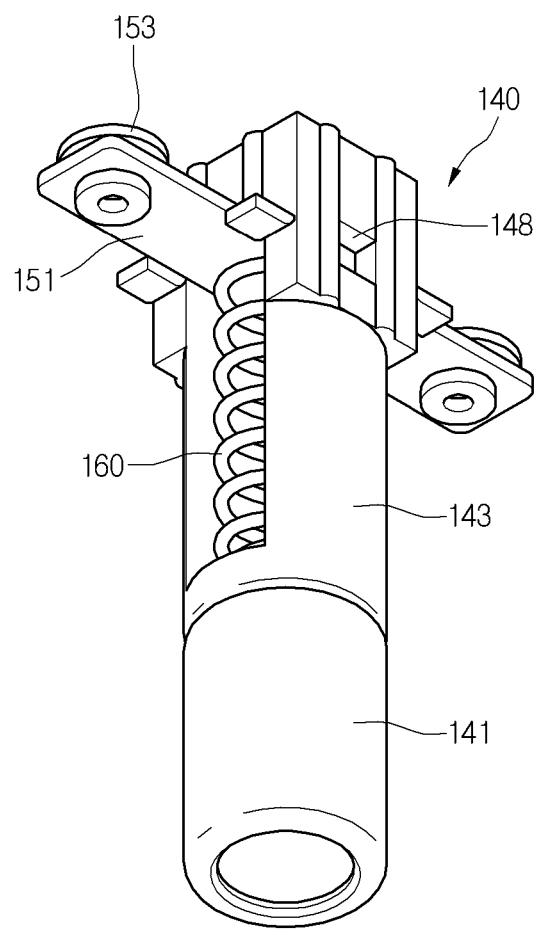
FIG. 5 is a perspective view of a movable unit according to an embodiment.
Figure 6:
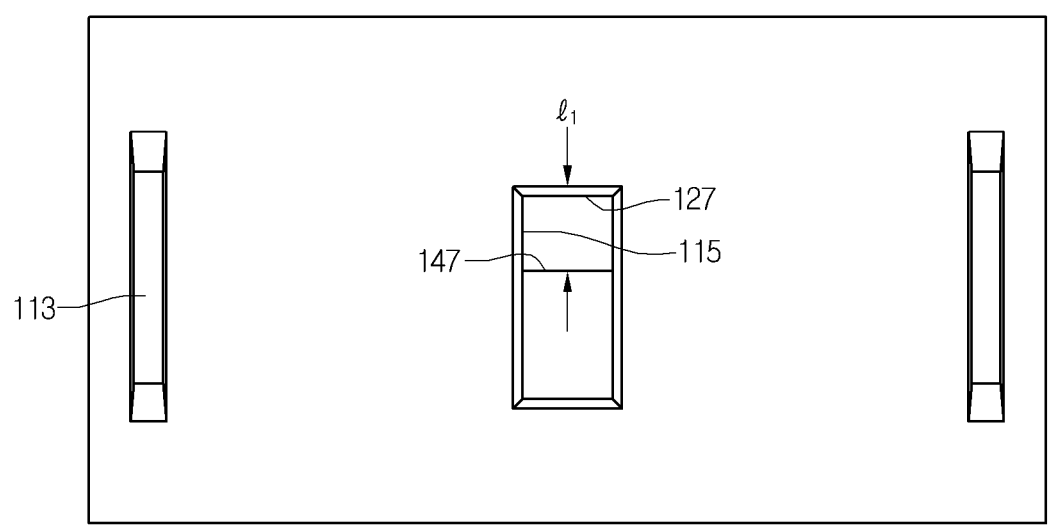
FIG. 6 is a view of the electronic switching device when a stroke value is detected according to an embodiment.
Figure 7:
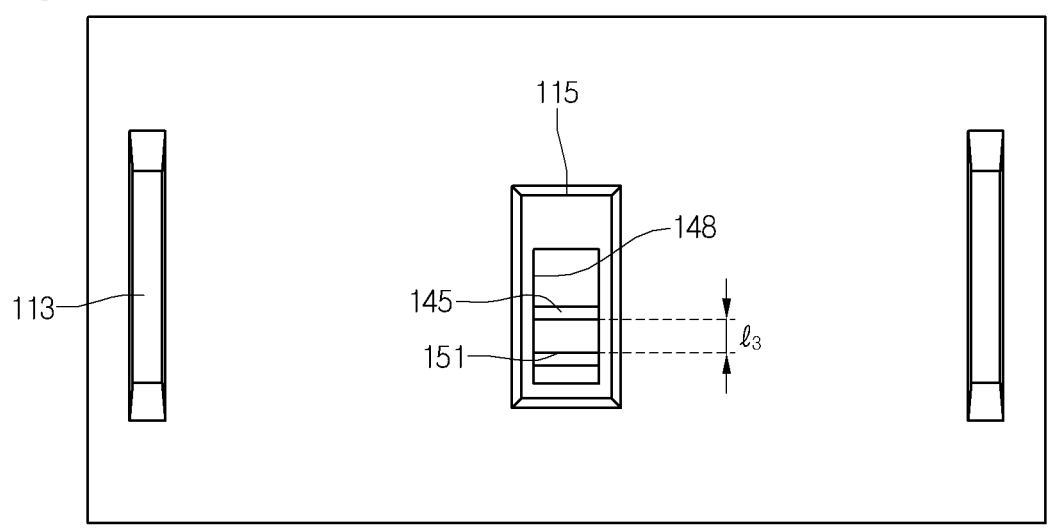
FIG. 7 is a view of the electronic switching device when a compression distance value is detected according to an embodiment.

FIG. 5 is a perspective view of the movable unit according to an embodiment, FIG. 6 is a view of the electronic switching device when a stroke value is detected according to an embodiment, and FIG. 7 is a view of the electronic switching device when a compression distance value is detected according to an embodiment.

Referring to FIG. 5, the movable unit 140 according to an embodiment has a second through hole 148 so that at least one portion of inner components of the movable unit 140 is exposed or observed.

In detail, at least one portion of an upper portion of the moving part 143 passes through the second through hole 148. The second through hole 148 may be defined in a position corresponding to positions at which the support corresponding part 145 and the contact support part 151 are disposed. Also, the second through hole 148 may have a size enough to observe the compression distance in a state where the support corresponding part 145 and the contact support part 151 are spaced apart from each other.

That is, in the state where the current is supplied to the electronic switching device 10 to space the support corresponding part 145 from the contact support part 151, an upper end of the second through hole 148 is disposed at a position higher than that of the support corresponding part 145, and a lower end of the second through hole 148 is disposed at a position lower than that of the contact support part 151.

A configuration when a stroke value and a compression distance value of the electronic switching device 10 are detected will be described with reference to FIGS. 6 and 7.

First, in a process for manufacturing the electronic switching device 10, the fixed unit 110, the movable unit 140, and the driving force generation unit 170 are assembled to complete the main body 100. Then, the main body 100 is accommodated in the housing 200 to complete the assembly of the electronic switching device 10.

As described above, when the current supply is blocked in the state where the assembly of the electronic switching device 10 is completed, as shown in FIG. 6, the upper end 147 of the moving part 143 may be exposed to and observed from the outside through the first through hole 115.

Also, as described above, since the interference surface 127 is disposed at a height corresponding to that of the upper end of the first through hole 115, a distance between the upper end 147 and the upper end of the first through hole 115 may be observed or detected as the stroke.

When the current is supplied, while the moving part moves in one direction, the second through hole may be disposed inside the first through hole with respect to the one direction. That is, as shown in FIG. 7, the second through hole 148 is disposed inside the first through hole 115 while the moving part 143 moves upward.

That is to say, the position or height of the second through hole 148 may be within a range of the position or height of the first through hole 115. That is to say, in the relatively height therebetween, the upper end of the first through hole 115 may have a height greater than that of the upper end of the second through hole 148, and the lower end of the first through hole 148 may have a height less than that of the lower end of the second through hole 148.

Also, the distance spaced between the support corresponding part 145 and the contact support part 151, i.e., the compression distance may be observed or detected through the first through hole 115.

In summary, the support corresponding part 145 and the contact support part 151 are disposed in a space between the upper and lower ends of the second through hole 148, and thus, the compression distance may be easily observed.

Figure 8:
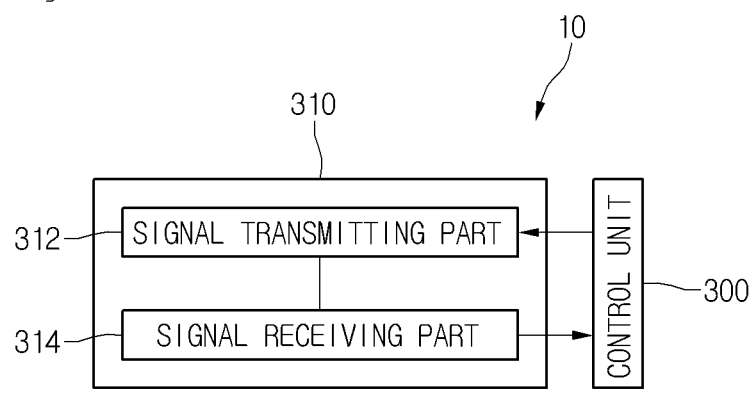
FIG. 8 is a block diagram of the electronic switching device according to an embodiment.

FIG. 8 is a block diagram of the electronic switching device according to an embodiment.

Referring to FIG. 8, the electronic switching device 10 according to an embodiment includes a distance detection unit 310 that transmits or receives a predetermined signal to the electronic switching device 10 in a performance inspection process of the electronic switching device 10 after the components are completely assembled. The predetermined signal may be a laser signal.

The distance detection unit 310 includes a signal transmitting part 312 for transmitting the predetermined signal and a signal receiving part 314 for receiving the signal that is transmitted from the signal transmitting part 312 and then reflected by the components of the device. For example, the signal transmitting part 312 and the signal receiving part 314 may be the same constitution.

A control unit 300 may control the signal transmitting part 312 to allow the predetermined signal to be transmitted to the electronic switching device 10. Thus, information with respect to a position of a component, e.g., the stroke or compression distance may be recognized through the signal received from the signal receiving part 314.

As described above, since the information with respect to the position of the component of the electronic switching device 10 is recognized through the distance detection unit 310, it may be determined whether the component in the state where the electronic switching device 10 is assembled is disposed within a normal range. That is, results with respect to whether the device is normally assembled and the performance of the device may be recognized.

Figure 9:
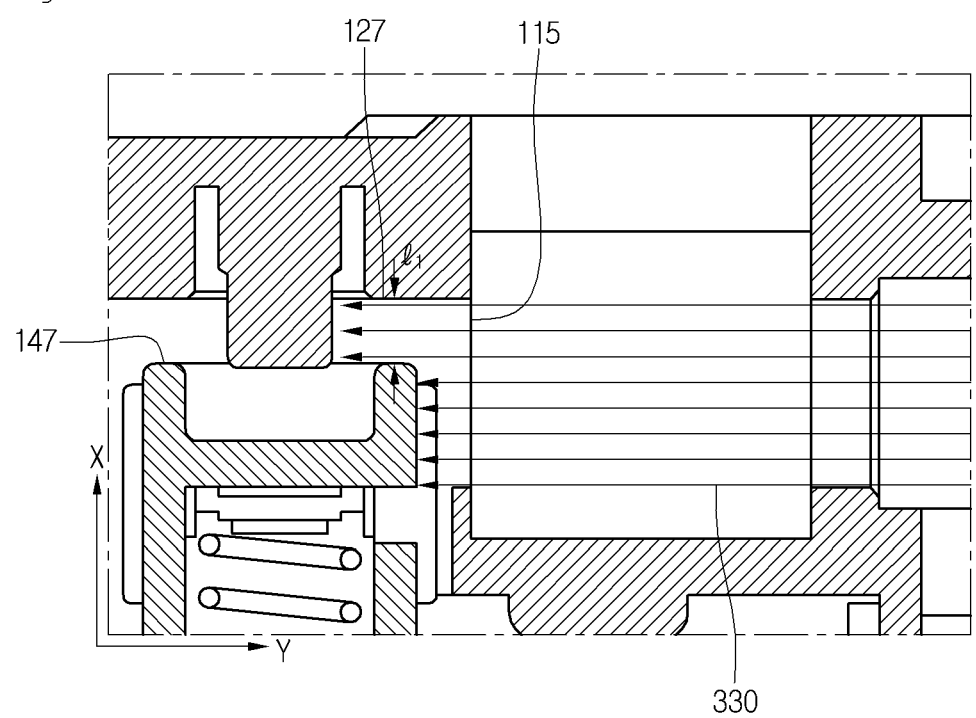
FIG. 9 is a view of a state in which a distance is detected by using a distance detection unit when the supply of the current into the electronic switching device is blocked according to an embodiment.
Figure 10:
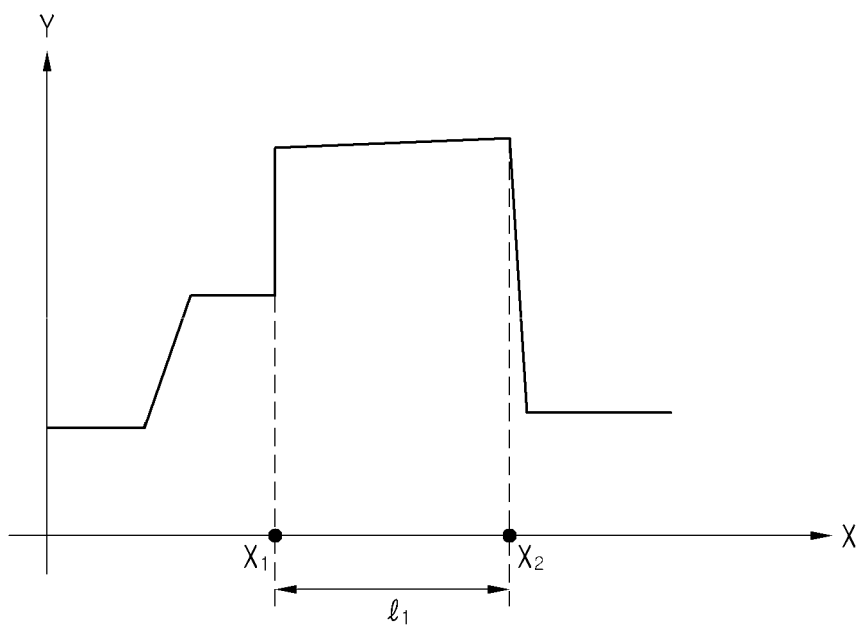
FIG. 10 is a graph illustrating results of the detected stroke value when the supply of the current into the electronic switching device is blocked according to an embodiment.

FIG. 9 is a view of a state in which a distance is detected by using the distance detection unit when the supply of the current into the electronic switching device is blocked according to an embodiment, and FIG. 10 is a graph illustrating results of the detected stroke value when the supply of the current into the electronic switching device is blocked according to an embodiment.

Referring to FIG. 9, when the electronic switching device 10 is completely assembled, in the state where power is not applied to the driving force generation unit 170, i.e., the current supply is blocked, a stroke value of the device may be measured by using the distance detection unit 310.

In detail, the distance detection unit 310 is disposed on a side of the electronic switching device 10 to transmit a first detection signal 330 while moving upward from an approximately central portion of the movable unit 140. The first detection signal 330 is reflected by a portion of the electronic switching device 10 and then received into the distance detection unit 310. Then, a distance value between the distance detection unit 310 and the portion of the electronic switching device 10 may be obtained on the basis of a received time.

Here, with respect to a starting point at which the signal is transmitted initially, as the distance detection unit 310 moves upward, an X-axis value (a position or height of the distance detection unit 310) may increase. Also, with respect to the starting point at which the signal is transmitted initially, as the X-axis value is changed, a Y-axis value (a distance between the distance detection unit 310 and the component) may be changed. Here, the starting point may be different according to a point at which the distance detection unit 310 is disposed initially.

Also, the Y-axis value may increase or decrease according to a shape or curve of the component of the device. In detail, referring to FIG. 10, a variation of the distance (the Y-axis value) between the distance detection unit and the component according to the position (the X-axis value) of the distance detection unit may be obtained as a graph.

Here, a distance value between the upper end 147 and the interference surface 127 which is detected via the first through hole 115 may be decided as the stroke $l_1$. That is, a distance value between an $X_1$ (the upper end) and an $X_2$ (the interference surface) may be decided.

Figure 11:
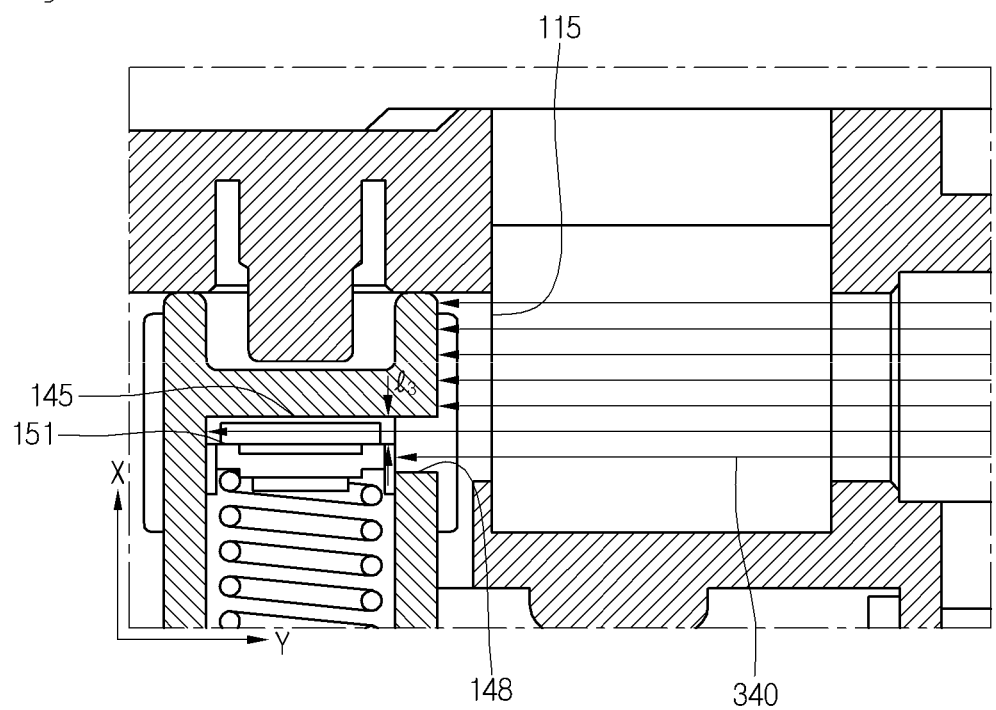
FIG. 11 is a view of a state a distance is detected by using the distance detection unit when the current is supplied into the electronic switching device according to an embodiment.
Figure 12:
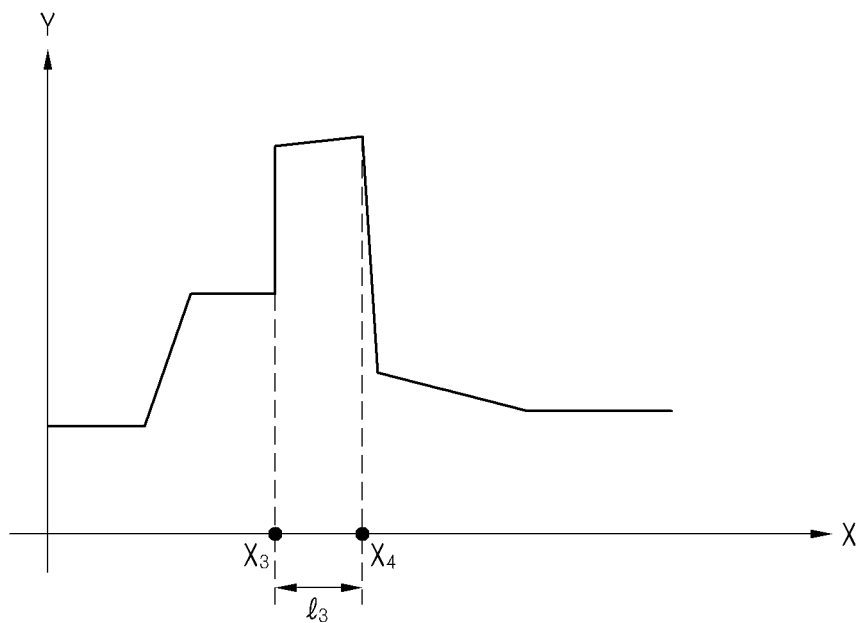
FIG. 12 is a graph illustrating results of the detected compression distance value when the current is supplied into the electronic switching device according to an embodiment.

FIG. 11 is a view of a state a distance is detected by using the distance detection unit when the current is supplied into the electronic switching device according to an embodiment, and FIG. 12 is a graph illustrating results of the detected compression distance value when the current is supplied into the electronic switching device according to an embodiment.

Referring to FIG. 11, when the electronic switching device 10 is completely assembled, in the state where power is applied to the driving force generation unit 170, i.e., the current is supplied, a compression distance value of the device may be measured by using the distance detection unit 310.

In detail, the distance detection unit 310 is disposed on a side of the electronic switching device 10 to transmit a second detection signal 340 while moving upward from the approximately central portion of the movable unit 140. Here, the X-axis value and the Y-axis value may be derived from the contents described in FIG. 9.

Also, the Y-axis value may increase or decrease according to a shape or curve of the component of the device. In detail, referring to FIG. 12, a variation of the distance (the Y-axis value) between the distance detection unit and the component according to the position (the X-axis value) of the distance detection unit may be obtained as a graph.

Here, a distance value between the contact support part 145 and the support corresponding part 145 which is detected via the first and second through holes 115 and 148 may be decided as the compression distance $l_3$. That is, a distance value between an $X_3$ (the contact support part) and an $X_4$ (the support corresponding part) may be decided.

FIG. 13 is a flowchart illustrating a method for manufacturing the electronic switching device according to an embodiment. A process for manufacturing the electronic switching device 10 will be described with reference to FIG. 13.

First, a process of assembling the electronic switching device is performed. That is, the fixed unit 110, the movable unit 140, and the driving force generation unit 170 are assembled to complete the main body 100. Then, the main body 110 and the housing 200 are coupled to complete the assembly of the electronic switching device 10 (S11).

Also, a performance inspection process of the electronic switching device 10 that is manufactured as a complete product is performed.

In detail, in a state where power is not applied to the electronic switching device 10 (S12), the electronic switching device 10 is scanned by using the distance detection unit 310.

While the electronic switching device 10 is scanned, the signal transmitted from the distance detection unit 310 is transmitted into a space between the upper end 147 and the interference surface 127 via the first through hole 115 to recognize a value of the signal reflected by a portion of the device, thereby measuring the stroke (S13).

Then, in a state where power is applied to the electronic switching device 10 (S14), the electronic switching device 10 is scanned by using the distance detection unit 310.

While the electronic switching device 10 is scanned, the signal transmitted from the distance detection unit 310 is transmitted into a space between the contact support part 151 and the support corresponding part 145 via the first and second through holes 115 to recognize a value of the signal reflected by a portion of the device, thereby measuring the compression distance (S15).

Then, when the stroke value and the compression distance value are measured, a value of the gap (=stroke−compression distance) may be obtained. The performance of the electronic switching device 10 may be decided through the stroke, compression distance, and gap values to inspect whether the device is faulty (S16).

As described above, since the signal is transmitted and received through the first through hole 115 of the fixed unit 110 and the second through hole 148 of the movable unit 140, the position information with respect to the component may be obtained. Thus, the performance inspection of the device may be effectively performed in the state where the electronic switching device is completely assembled.

According to the embodiments, since the factors for deciding the performance of the device are successively inspected after the components of the electronic switching device are completely assembled, the inspection efficiency may be improved.

Also, the distance detection unit may be disposed on the side of the through hole defined in the electronic switching device, and then the stroke and the compression distance may be successively inspected while the distance detection unit moves. Thus, the manufacturing and inspection processes of the device may be simply performed.

As a result, the error with respect to the performance inspection results of the device may be reduced, and the complete product may be reduced in failure rate.

Also, since the performance inspection is performed in a lump in the state where the electronic switching device is completely assembled, and a product number (a serial number) with respect to the device is given, the production and management of the product may be easily realized.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electronic switching device comprising:
    a fixed unit comprising a fixed unit body defining an outer appearance of the fixed unit and a fixed contact part located within the fixed unit body;
    a movable unit comprising a movable contact part selectively contacting the fixed contact part to supply current;
    a moving part provided in the movable unit to guide movement of the movable contact part toward the fixed contact part;
    a coil to which power is applied to move the moving part; and
    an elastic member that is elastically deformable while the moving part moves,
    wherein at least the fixed unit or the moving part has a through hole,
    wherein an inner component of the fixed unit or the moving part communicates externally to allow a preset signal to pass through the through hole,
    wherein the through hole comprises a first through hole passing through the fixed unit body and a second through hole through which at least one portion of the moving part moves, and
    wherein the second through hole is located inside the first through hole with respect to a direction in which the moving part passes.

2. The electronic switching device according to claim 1, wherein the fixed unit further comprises an interference surface interfering with an upper end of the moving part when the movable contact part moves toward the fixed contact part.

3. The electronic switching device according to claim 2, wherein the interference surface is located at a position or height corresponding to a position or height of an upper end of the first through hole.

4. The electronic switching device according to claim 3, wherein:
    the fixed unit and the movable unit are assembled; and
    a signal transmitted from a distance detection unit via the first through hole scans a distance between the upper end of the moving part and the interference surface.

5. The electronic switching device according to claim 2, wherein a space between the upper end of the moving part and the interference surface is exposed externally via the first through hole when power is not applied to the coil.

6. The electronic switching device according to claim 1, wherein the movable unit further comprises:
    a contact support part on which the movable contact part is seated, the contact support part supported by a side of the elastic member; and
    a support corresponding part movably provided on a side of the contact support part to contact the contact support part when power is not applied to the coil.

7. The electronic switching device according to claim 6, wherein a space between the contact support part and the support corresponding part is exposed externally via the second through hole when power is applied to the coil.

8. The electronic switching device according to claim 7, wherein:
    the moving part moves vertically;
    an upper end of the second through hole is located at a position higher than a position of the support corresponding part; and
    a lower end of the second through hole is located at a position lower than a position of the contact support part.

9. The electronic switching device according to claim 6, wherein:
    the fixed unit and the movable unit are assembled: and
    a signal transmitted from a distance detection unit via the first and second through holes scans a distance between the contact support part and the support corresponding part.

* * * * *